(12) United States Patent
Ni

(10) Patent No.: US 7,249,978 B1
(45) Date of Patent: Jul. 31, 2007

(54) REDUCED-LENGTH, LOW-PROFILE USB DEVICE AND CARD-LIKE CARRIER

(75) Inventor: Jim Ni, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/257,575

(22) Filed: Oct. 24, 2005

(51) Int. Cl.
*H05K 5/06* (2006.01)
(52) U.S. Cl. .............. 439/660; 439/76.1; 439/946; 361/752; 361/785; 361/791; 361/756
(58) Field of Classification Search .......... 439/660, 439/76.1, 946, 945; 361/752, 785, 791, 756
See application file for complete search history.

(56) References Cited

U.S. PATENT DOCUMENTS

| | | | |
|---|---|---|---|
| 5,846,092 A * | 12/1998 | Feldman et al. ........... 439/76.1 |
| 6,050,848 A * | 4/2000 | Yao ............................. 439/483 |
| 6,309,255 B1 | 10/2001 | Yu | |
| 6,381,143 B1 * | 4/2002 | Nakamura .................. 361/737 |
| 6,386,920 B1 * | 5/2002 | Sun ............................. 439/630 |
| 6,547,603 B1 * | 4/2003 | Yu .............................. 439/638 |
| 6,618,243 B1 | 9/2003 | Tirosh | |
| 6,671,808 B1 | 12/2003 | Abbott et al. | |
| 6,729,909 B2 * | 5/2004 | Nogami ....................... 439/630 |
| 6,744,634 B2 * | 6/2004 | Yen ............................. 361/752 |
| 6,854,984 B1 | 2/2005 | Lee et al. | |
| 7,059,871 B1 * | 6/2006 | Hsiao ......................... 439/76.1 |
| 2003/0100203 A1 | 5/2003 | Yen | |

* cited by examiner

*Primary Examiner*—Gary F. Paumen
(74) *Attorney, Agent, or Firm*—Bever, Hoffman & Harms, LLP; Patrick T. Bever

(57) ABSTRACT

A USB device in which all of the devices ICs are located on a lower surface of a PCB (i.e., opposite to the metal contacts) to minimize the device's thickness, and at least one of the ICs is positioned on a relatively narrow portion of the USB plug to minimize the device's length. A card-like carrier for protecting the USB device when not in use includes a frame-like base portion having peripheral walls surrounding a relatively wide main chamber, and an end portion that is attached to the base portion and includes end walls that define a relatively narrow slot communicating with the main chamber. The USB device plug structure is inserted through the main chamber into the slot until a front edge of the handle structure abuts the end walls, and then the device is rotated downward into the main chamber.

8 Claims, 9 Drawing Sheets

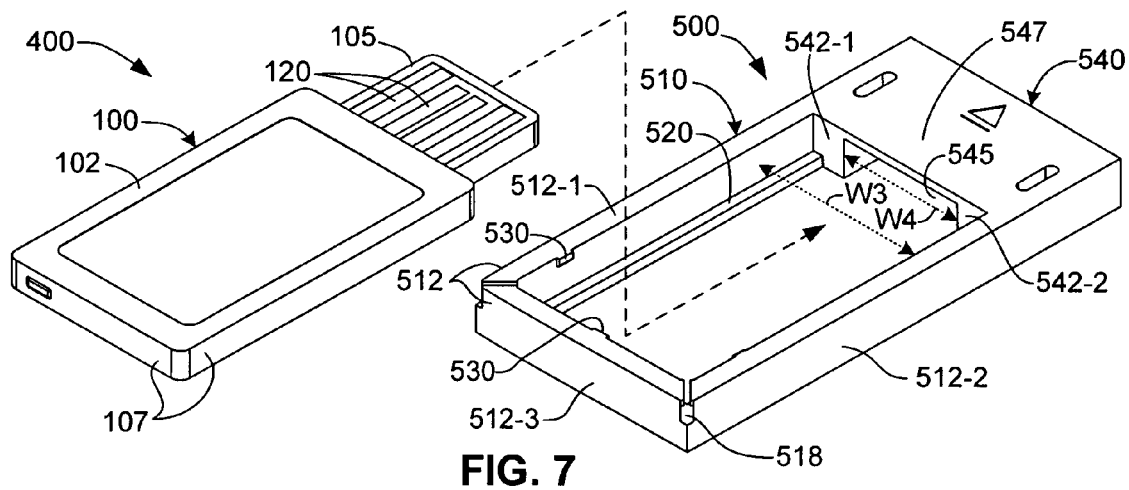
FIG. 7
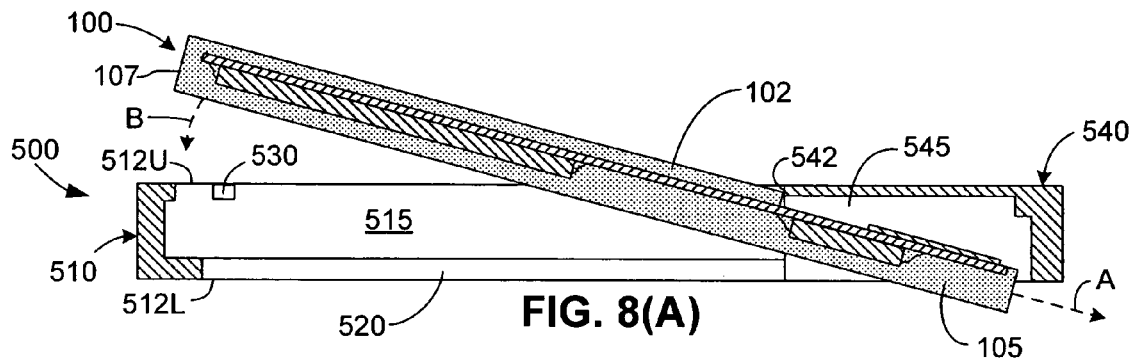
FIG. 8(A)
FIG. 8(B)
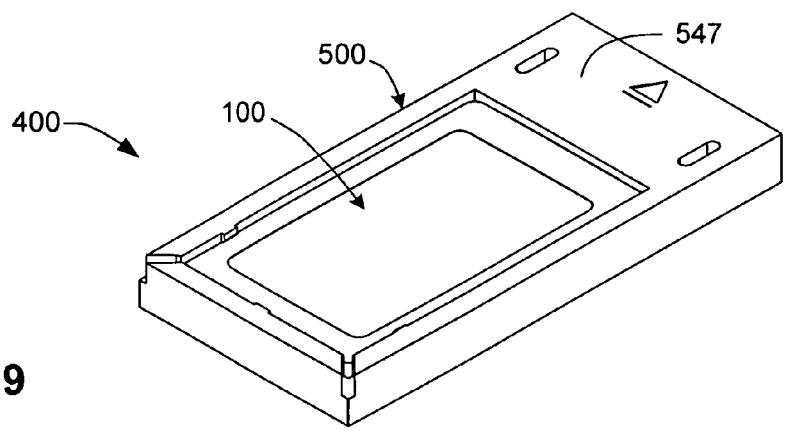
FIG. 9

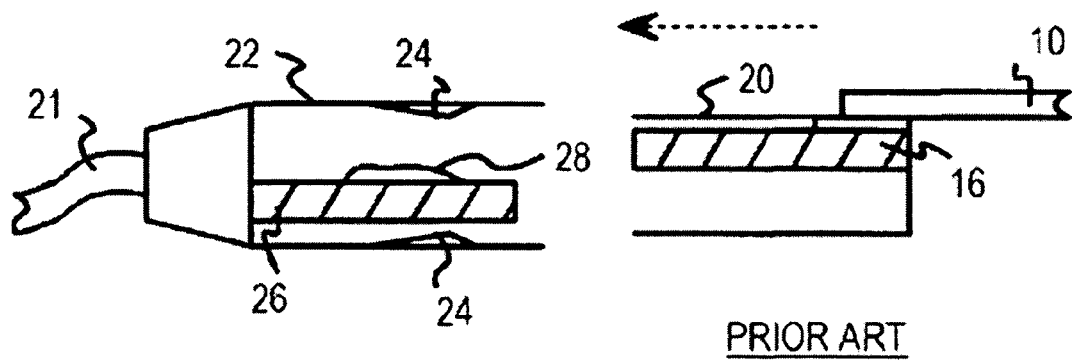
FIG. 13(A) PRIOR ART
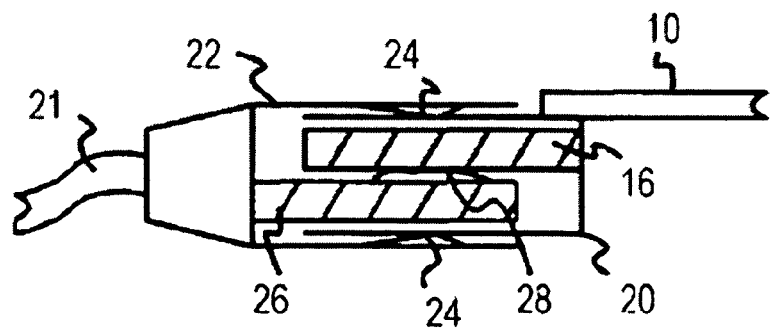
PRIOR ART FIG. 13(B)

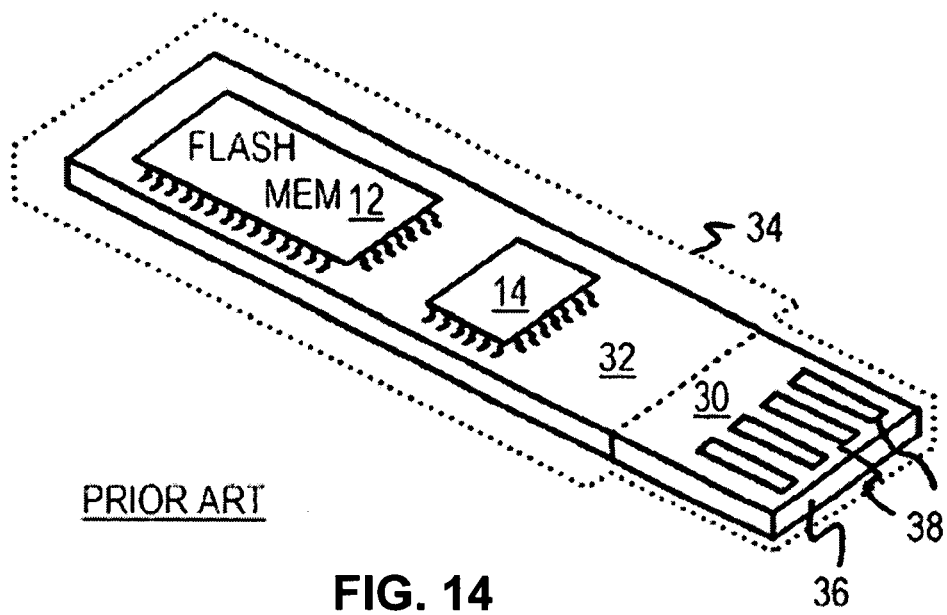
PRIOR ART
FIG. 14
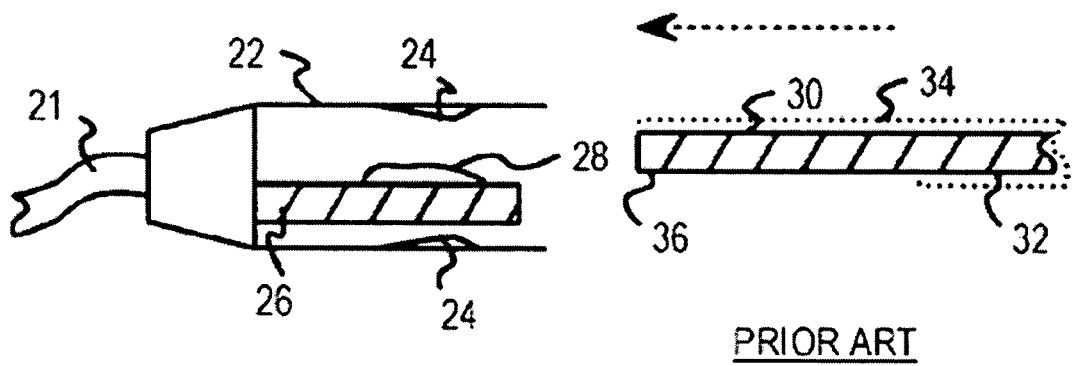
PRIOR ART
FIG. 15(A)
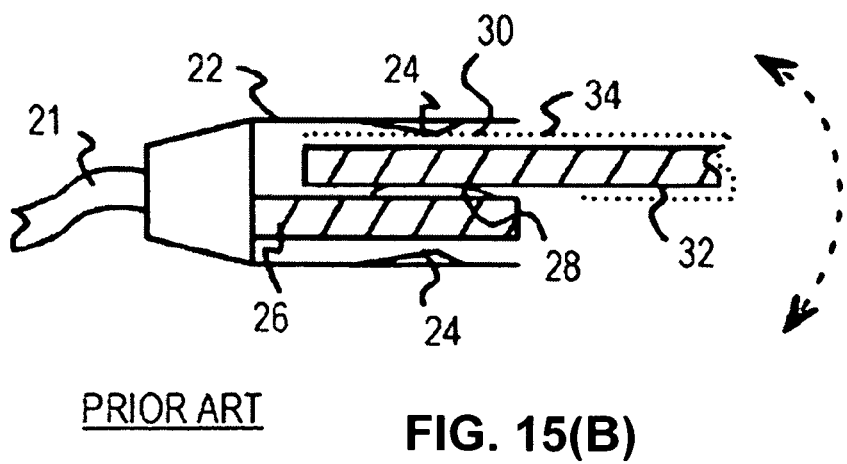
PRIOR ART  FIG. 15(B)

US 7,249,978 B1

REDUCED-LENGTH, LOW-PROFILE USB DEVICE AND CARD-LIKE CARRIER

FIELD OF THE INVENTION

This invention relates to portable electronic devices, and more particularly to portable electronic devices that utilize the Universal-Serial-Bus (USB) specification.

BACKGROUND OF THE INVENTION

Rapid advances in technology in several areas have converged to enable small, portable memory cards with vast capacities. Flash memory technologies such as those using electrically-erasable programmable read-only memory (EEPROM) have produced chips storing 128 M-Bytes or more. Small flash-memory cards have been designed that have a connector that can plug into a specialized reader, such as for compact-flash, secure-digital, memory stick, or other standardized formats.

More recently, flash memory cards are being sold that contain a USB connector. Such USB-flash memory cards do not require a specialized reader but can be plugged into a USB connector on a host system, such as a personal computer (PC). These USB-flash memory cards can be used in place of floppy disks. A USB-flash card can have a capacity of more than ten floppy disks in an area not much larger than a large postage stamp.

FIG. 12(A) shows a prior-art flash-memory card with a conventional male USB connector. Flash memory chip 12 may be a 128 Mega-byte non-volatile chip or may have some other capacity. Controller chip 14 contains a flash-memory controller that generates signals to access memory locations within flash memory chip 12. Controller chip 14 also contains a USB interface controller that serially transfers data to and from flash memory chip 12 over a USB connection.

Male USB connector 20 may be mounted on board 10, which is a small circuit board with chips 12, 14 mounted thereon. Multi-layer printed-circuit board (PCB) technology can be used for board 10. A plastic case (not shown) can surround board 10.

Male USB connector 20 contains a small connector substrate 16, which is often white ceramic, black rigid plastic, or another sturdy substrate. Connector substrate 16 has four or more metal contacts 18 formed thereon. Metal contacts 18 carry the USB signals generated or received by controller chip 14. USB signals include power, ground, and serial differential data D+, D−.

Male USB connector 20 contains a metal case that wraps around connector substrate 16. The metal case touches connector substrate 16 on three of the sides of connector substrate 16. The top side of connector substrate 16, holding metal contacts 18, has a large gap to the top of the metal case. On the top and bottom of this metal wrap are formed holes 15. USB connector 20 is a type-A USB connector.

FIG. 12(B) shows a female USB socket connector 22. Female USB socket connector 22 can be an integral part of a PC or other host system, or can be connected by cable 21 to such a host system. Another connector substrate 26 contains four metal contacts 28 that make electrical contact with the four metal contacts 18 of the male USB connector 20 of FIG. 12(A). Connector substrate 26 is wrapped by a metal case, but small gaps are between the metal case and connector substrate 26 on the lower three sides.

Locking is provided by metal springs 24 in the top and bottom of the metal case. When male USB connector 20 of FIG. 12(A) is flipped over and inserted into Female USB socket connector 22 of FIG. 12(B), metal springs 24 lock into holes 15 of male USB connector 20.

FIGS. 13(A) and 13(B) are cross-sections highlighting connections between male and female USB connectors. Female USB socket connector 22 is on the left while male USB connector 20 is being inserted from the right. Male USB connector 20 is flipped over relative to the view of FIG. 12(A). Metal contacts 18 are formed on the lower surface of connector substrate 16 on male USB connector 20, while metal contacts 28 are formed on the upper surface of connector substrate 26 on female USB socket connector 22. Thus the metal contacts face one another to allow for electrical contact when male USB connector 20 is inserted into female USB socket connector 22 as shown in FIG. 13(B).

Metal springs 24 formed on the metal case surrounding connector substrate 26 on female USB socket connector 22 fit into holes on the metal case of male USB connector 20. This helps to lock the connectors together.

A problem associated with the production of conventional male USB devices that utilize standard male USB plug connectors typically require lead-based soldering methods to attach the standard plug structure (e.g., substrate 16 and plug shell 11) to circuit board 10. Lead (Pb) is recognized as a hazardous material, and may at some point in time be banned from use. Lead-free soldering requires higher peak temperatures (about 240° C.) that can shrink or warp plastic substrates, thereby making such conventional USB plug connector structures unsuitable for lead-free fabrication processes.

FIG. 14 shows a prior-art USB flash memory card using a low-profile USB connector. Male USB connector 20 of FIGS. 13 and 14 is relatively large. The metal case in particular is cumbersome and increases manufacturing cost. Costs may be reduced by integrating male USB connector 30 with board 32. Board 32 is a PCB that has flash memory chip 12 and controller chip 14 mounted thereon. Board 32 is extended to include male USB connector 30, which has metal contacts 38 formed on end 36 of board 32.

The width and thickness of board 32 at end 36 containing male USB connector 30 is designed to approximately match that of connector substrate 16 of FIG. 12(A). Plastic case 34 can enclose board 32 but have an opening for metal contacts 38. Plastic case 34 can cover the bottom and sides of male USB connector 30 up to end 36 to emulate portions of the metal case of the male USB connector of FIG. 12(A).

FIGS. 15(A) and 15(B) show cross-sections of the prior-art low-profile USB connector being inserted into a standard female USB connector. Board 32 that has male USB connector 30 formed on end 36 is flipped over from the view shown in FIG. 14, and end 36 is inserted into female USB socket connector 22 from the right side.

Metal contacts 38 are located on the lower surface of male USB connector 30. Plastic case 34 has an opening on the lower surface of male USB connector 30 to expose the metal contacts so they can make electrical connection with metal contacts 28 on the upper surface of connector substrate 26 of female USB socket connector 22 when inserted as shown in FIG. 15(B).

Plastic case 34 helps to fill the gate between board 32 and the top edge of the metal case of female USB socket connector 22. However, no holes are provided in plastic case 34, so metal springs 24 are pushed up slightly when male USB connector 30 is inserted into female USB socket connector 22. Plastic case 34 is also formed along the thin edges of board 32 and helps to fill in the gaps between connector substrate 26 and the sides of the metal case of female USB socket connector 22 that are above and below the plane of FIG. 15(B).

There is currently a demand for USB devices that include large capacity memory chips, but are very small in size for easy transportation. A problem with miniaturizing low-profile USB connector 30 shown in FIG. 14 is that, although the height of the plug section of male USB connector 30 is reduced, the thickness of the plastic case 34 is significantly thicker than the plug portion. Thus, reducing the profile (height) of male USB connector 30 is limited in part by the height of flash memory chip 12 and controller chip 14. Further, reducing the overall length of male USB connector 30 is limited by the length of board 32, which in turn is limited by the space needed for flash memory chip 12, controller chip 14 and metal contacts 38. Moreover, even if it were possible to reduce both the height and length of the male USB connector 30, the resulting smaller card structure would necessarily be easier to accidentally bend or otherwise damage when not in use (i.e., when being carried in a user's pocket). Further, because the plug shell is omitted, contacts 38 are essentially unprotected when the prior-art USB flash memory card is not in use, thus exposing metal contacts 38 to damage.

What is needed is a reduced-length, low-profile USB device that has minimal outer dimensions, thus minimizing manufacturing costs. Further, what is needed is a card-like carrier for protecting the reduced-length, low-profile USB device that both supports the peripheral edges of the device housing and covers the metal contacts when the USB device is not in use.

SUMMARY OF THE INVENTION

The present invention is directed to a USB device in which all of the device's ICs are located on a lower surface of the Printed Circuit Board (i.e., opposite to the metal contacts) to minimize the device's thickness, where at least one of the ICs is positioned on a relatively narrow plug portion of the PCB to minimize the device's length, thereby providing a reduced-length, low-profile USB device having smaller outer dimensions and lower manufacturing costs when compared to conventional USB devices.

In accordance with an aspect of the present invention, a thickness of the USB device's handle structure is substantially equal to and coplanar with the low-profile thickness of the USB device's plug structure. To minimize the overall height (thickness) of the USB device to the thickness of the plug structure, a PCB Assembly is provided that includes metal contacts formed on a first (e.g., upper) surface of a PCB, and all IC components (e.g., USB controller chip, flash memory chip, etc.) mounted on the opposite (e.g., lower) surface of the PCB. A housing is then mounted or otherwise formed over the IC components (i.e., over the lower surface of the PCBA) that includes a plug section extending opposite to the metal contacts to provide the necessary plug structure thickness, and a handle section that covers the IC components. The housing has a planar cover plate that is parallel to the PCB and extends along the entire length of the USB device (e.g., from a front edge of the plug structure to a rear edge of the handle structure). Accordingly, the thickness of the handle structure is made substantially equal to the plug structure thickness, which is required for secure and reliable connection to a standard female USB socket connector, thus producing a flat, low-profile (thin) structure that can be easily carried in a user's pocket, or incorporated into a utility tool.

In accordance with another aspect of the present invention, a USB controller IC of the reduced-length, low-profile USB device is mounted at least partially on a relatively narrow PCB plug section of the PCBA, and in one specific embodiment is located directly below the metal contacts to facilitate a reduced length of the USB device. The PCB has a relatively wide handle section and the relatively narrow plug section that extends from a front edge of the handle section. Larger ICs (e.g., flash memory chips) are mounted on the relatively wide handle section. The metal contacts are disposed on the upper surface of the relatively narrow plug section, which has a width that is determined by standard USB female connectors. The USB controller IC, which is electrically connected to the metal contacts and controls USB-defined communication operations between the USB device and a host, is mounted onto the lower surface of the PCB at least partially on the PCB plug section, and in one embodiment is located directly below the metal contacts. By positioning the USB controller IC on the lower surface of the PCB plug section, and in particular below the metal contacts, instead of on the PCB handle section as in conventional USB devices, the PCB body section can be made smaller (i.e., because the handle space conventionally used for the IC controller is no longer needed), thereby allowing a reduction in the overall length of the PCB handle section. As such, this arrangement facilitates the production of shorter, low profile USB devices that require less material and, hence, are less expensive to manufacture.

The present invention is also directed to a card-like carrier for protecting low-profile USB devices when not in use. The card-like carrier includes a frame-like base portion having peripheral walls surrounding a relatively wide main chamber, and an end portion that is attached to the base portion and includes end walls that define a relatively narrow slot. A reduced-length, low-profile USB device is mounted onto the carrier by inserting the plug structure through the main chamber into the slot until a front edge of the handle structure abuts the end walls, and then rotating the handle structure downward into the main chamber until a peripheral edge of the handle structure is parallel to the carrier base portion. Support structures are provided on lower edges of the body portion peripheral walls, and one or more locking structures disposed along upper edges of the peripheral walls. In one embodiment, the locking structures include short protrusions that allow snap-coupling of the handle structure into the main chamber, and the support structures include rails that support a lower surface of the handle structure. Therefore, when the USB device snap-coupled into the carrier, the peripheral edge of the handle structure is surrounded by the peripheral wall of the carrier, thereby protecting the USB device housing from damage when not in use. In addition, the end portion includes a protective cover wall that covers the metal contacts of the USB device plug structure, thereby protecting the metal contacts of the USB device from contamination or damage when not in use.

BRIEF DESCRIPTION OF THE DRAWINGS

These and other features, aspects and advantages of the present invention will become better understood with regard to the following description, appended claims, and accompanying drawings, where:

FIG. 7 is an exploded perspective view showing an USB device and card-like carrier according to another embodiment of the present invention;

FIGS. 8(A) and 8(B) are cross-sectional side views showing the USB device mounted inside the carrier of FIG. 7;

FIG. 9 is a perspective view depicting an assembly including the USB device and carrier shown in FIG. 7;

FIGS. 13(A) and 13(B) are cross-sections highlighting connections between male and female USB connectors;

FIG. 14 shows a prior-art USB flash memory card using a low-profile USB connector; and FIGS. 15(A) and 15(B) show cross-sections of the prior-art low-profile USB connector being inserted into a standard female USB connector.

DETAILED DESCRIPTION OF THE DRAWINGS

The present invention relates to an improvement in low-profile USB connectors. The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
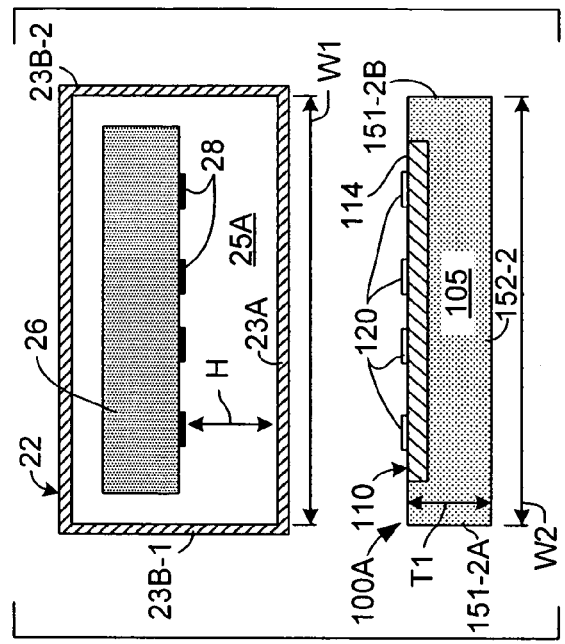
FIGS. 1(A) and 1(B) are perspective and cross sectional side views showing an exemplary USB device according to an embodiment of the present invention.
Figure 1B:
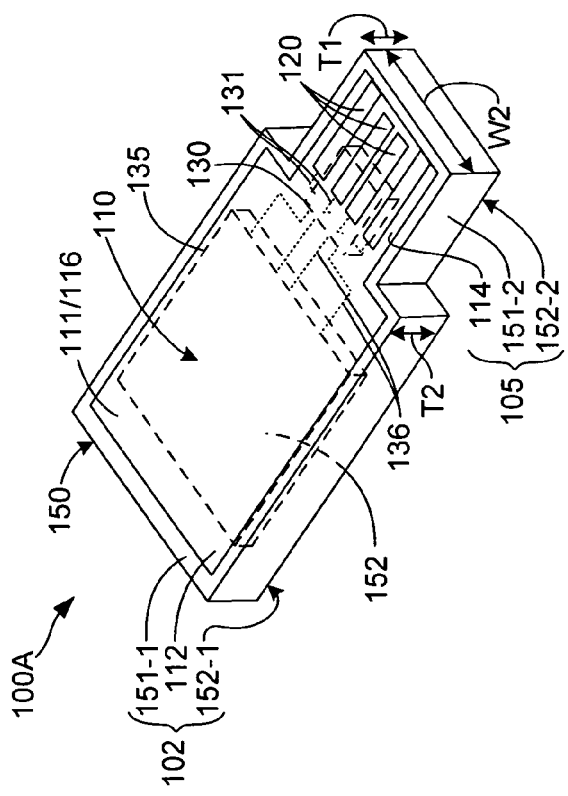

FIGS. 1(A) and 1(B) are exploded and assembled perspective views showing a reduced length, low-profile Universal-Serial-Bus (USB) device 100A according to a first embodiment of the present invention. USB device 100A generally includes a printed circuit board assembly (PCBA) 110 and a plastic housing 150 that is fixedly mounted onto PCBA 110.

Figure 3A:
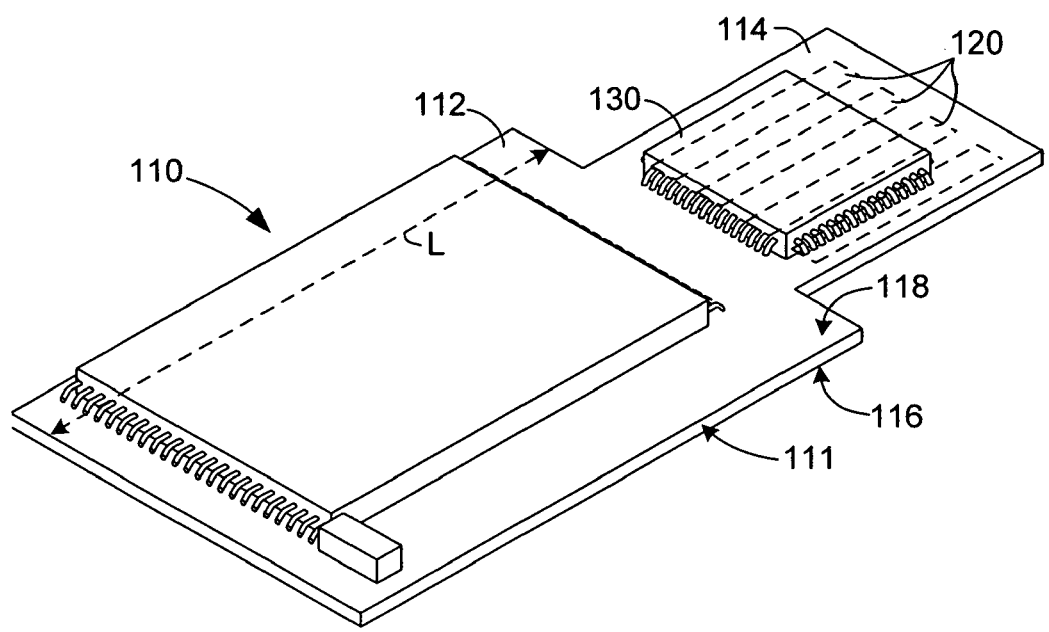
FIGS. 3(A) and 3(B) are perspective and cross-sectional side views showing a printed circuit board assembly (PCBA) of the USB device shown in FIG. 1(A)

Referring to the upper portion of FIG. 1(A) and to FIG. 3(A), PCBA 110 includes a printed circuit board (PCB) 111 including a relatively wide PCB handle section 112 and a relatively narrow PCB plug section 114 that extends from a front end of PCB handle section 112. PCB 111 is a substantially flat substrate, and has opposing sides that are referred to below as upper (first) surface 116 and lower (second) surface 118. Formed on upper surface 116 in plug section 114 are a plurality of metal contacts 120. Metal contacts 120 are shaped and arranged in a pattern established by the USB specification. According to an aspect of the invention, at least one control integrated circuit (IC) 130 and zero or more auxiliary ICs 135 (e.g., a flash memory device or an RF communication circuit) are mounted solely on lower surface 118 (i.e., on the side of PCB 111 opposite to metal contacts 120). ICs 130 and 135 are electrically connected to each other and to metal contacts 120 by way of metal traces 131 and 136, a few of which being depicted in FIG. 1(A) in a simplified manner by dashed lines. PCB 111 is formed in accordance with known PCB manufacturing techniques such that metal contacts 120 and ICs 130 and 135 (as well as zero or more other circuit components, which are omitted for brevity) are electrically interconnected by a predefined network including conductive traces 131 and 136 and other conducting structures that are sandwiched between multiple layers of an insulating material (e.g., FR4) and adhesive.

Housing 150 is arranged such that substantially all of the plastic used to form housing 150 is located below upper surface 116 of PCB 111. Housing 150 includes a peripheral wall 151 extending downward, perpendicular to PCB 111, and a lower cover plate 152 that extends parallel to PCB 111. For discussion purposes, the portion of peripheral wall 151 surrounding handle section 112 of PCB 111 is referred to below as handle wall section 151-1, and the section of peripheral wall 151 surrounding plug section 114 of PCB 111 is referred to below as plug wall section 151-2. Similarly, the portion of cover plate 152 covering handle section 112 of PCB 111 is referred to below as handle cover section 152-1, and the section of cover plate 152 covering plug section 114 of PCB 111 is referred to below as plug cover section 152-2.

Referring again to FIG. 1(A), a handle structure 102 of USB device 100A is formed by handle wall section 151-1, handle cover section 152-1, and the exposed upper surface 116 of PCB handle section 112. Similarly, a plug structure 105 of USB device 100A is formed by plug wall section 151-2, plug cover section 152-2, and the exposed upper surface 116 of PCB plug section 114.

Figure 2A:
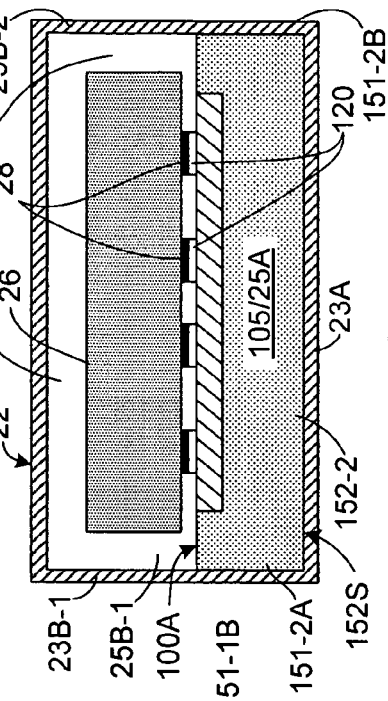
FIGS. 2(A) and 2(B) are cross-sectional end views showing a standard female USB socket connector and the plug structure of the USB device of FIG. 1(A) in separated and assembled conditions, respectively.
Figure 2B:
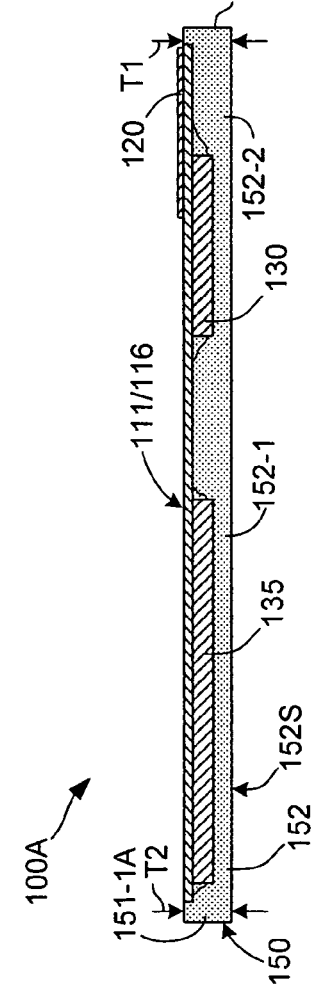

Referring to FIGS. 2(A) and 2(B), a thickness T1 and width W1 of plug structure 105 is selected to produce a secure (snug) fit inside standard female USB socket connector 22 (described above). Referring to FIG. 2(A), a height H between metal contacts 28 (i.e., a lower surface of connector substrate 26) and a lower wall 23A of the surrounding metal case is set by the USB standard at approximately 2.5 mm. Thickness T1 is set, for example, at 2.4 mm to assure a snug fit of plug structure 105 inside lower region 25A of female USB socket connector 22 (i.e., without significant vertical wobble) with metal contacts 120 in secure electrical contact with metal contacts 28 (as indicated in FIG. 2(B)). Similarly, a width W between side walls 23B-1 and 23B-2 of the metal case is set by the USB standard at approximately 12.5 mm. Width W2 of plug structure 105 (i.e., between the outermost surfaces of side walls 151-2A and 151-2B) is set, for example, at 12 mm to further assure the snug fit of plug structure 105 inside lower region 25A of female USB socket connector 22. Note that plug structure 105 is referred to as "low-profile" and "half-height" herein in that plug structure 105 is only inserted into lower region 25A of female USB socket connector 22 (i.e., side regions 25B-1 and 25B-2 and upper region 25C, which are normally occupied by the metal case of a standard male USB plug connector, remain unoccupied by low-profile plug structure 105).

According to an aspect of the present invention, lower cover plate 152 includes a planar surface 152-S that is parallel to the PCB, and defines a single plane such that a first thickness T1 of plug structure 105 (i.e., measured between upper PCB surface 116 and planar surface 152S adjacent to metal contacts 120) is substantially equal to a second thickness T2 of handle section 102 (i.e., measured between upper PCB surface 116 and planar surface 152 adjacent to IC 135. That is, as indicated in FIG. 1(B), USB device 100A is substantially flat along its entire length (i.e., from rear edge 151-1A to front edge 151-1B). The term "substantially flat" is meant to indicate that planar surface 152S is substantially parallel to an uppermost surface of USB device 100A along its entire length. In the embodiment shown in FIGS. 1(A) and 1(B), the uppermost surface of USB device 100A is defined in part by upper surface 116 of PCB 111, which is parallel to planar surface 152 along the entire length of USB device 100A. Similarly, the term "substantially flat" is also intended to cover embodiments described below in which the housing includes a thin wall structure that is formed on or otherwise contacts the upper surface of the PCB. In these embodiments, the thickness T2 of handle structure 102 may differ by a small amount (e.g., 5% from thickness T1 of plug structure 105.

According to another aspect of the present invention, the "flatness" associated with USB device 100A is achieved by mounting all of the IC "chips" and other electronic components of USB device 100A on lower surface 118 of PCB 111 (i.e., on the side opposite to metal contacts 120). That is, the minimum overall thickness of USB device 100A is determined by the thickness T1, which is required to maintain a snug connection between plug structure 105 and female USB socket connector 22 (as indicated in FIG. 2(B)). Because this arrangement requires that metal contacts 120 be located at the uppermost surface, and that plug wall section 151-2 plug and cover section 152-2 extend a predetermined distance below PCB 111 to provide the required thickness T1. Thus, the overall thickness of USB device 100A can be minimized by mounting the ICs 130 and 135 only on lower surface 118 of PCB 111. That is, if the ICs are mounted on upper surface 116, then the overall thickness of the resulting USB structure would be the required thickness T1 plus the thickness that the ICs extend above PCB 111 (plus the thickness of a protective wall, if used).

According to another aspect associated with the embodiment shown in FIGS. 1(A) and 1(B), upper surface 116 of PCB 111 is entirely exposed on the upper surface of USB device 100A, thus facilitating the production of USB device 100A with a maximum thickness equal to thickness T1 of plug structure 105. That is, because metal contacts 120 are formed on upper surface 116, and upper surface 116 defines the higher end of required plug structure thickness T1, the overall height of USB device 100A can be minimized by exposing upper surface 116 (i.e., by making any point on upper PCB surface 116 the uppermost point of USB device 100A). As indicated in FIG. 1(A), in accordance with feature specifically associated with USB device 100A, peripheral wall 151 extends around and covers the peripheral side edges of PCB 111, and an upper edge of peripheral wall 151 is coplanar with upper surface 116 of PCB 111. By covering the peripheral side edge of PCB 111, peripheral wall 151 prevents objects from wedging between PCB 111 and housing 150, thereby preventing undesirable separation of PCBA 110 from housing 150.

Figure 3B:
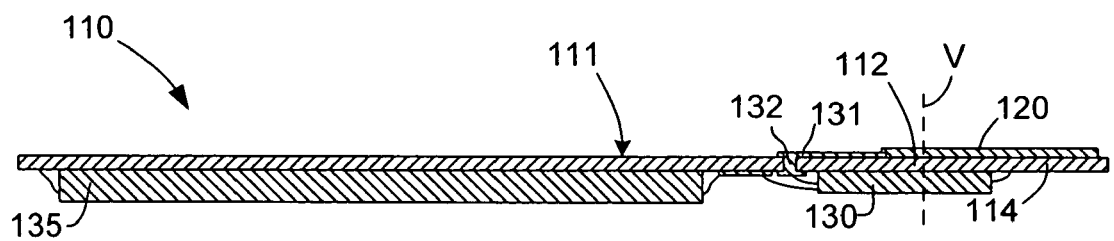

Referring to FIGS. 3(A) and 3(B), according to another aspect of the present invention, controller IC 130 at least partially extends onto plug section 114 on lower surface 118, and one or more auxiliary ICs 135 (e.g., flash memory devices and/or a RF communication circuits) are respectively mounted on handle section 112 on lower surface 118. As indicated in FIG. 3(B), electrical contact between metal contacts 120 and controller IC 130 is facilitated by metal via structures 132 that extend through PCB 111 using known methods. The positioning of USB controller IC 130 on plug portion 114 is facilitated by the smaller footprint of USB controllers. In accordance with a further aspect, as indicated by the dashed vertical line "V" in FIG. 3(B), at least a portion of USB controller IC 130 is located directly below contact pads 120. By positioning USB controller IC 130 on lower surface 118 of PCB plug section 114, and in particular below metal contacts 120, instead of on PCB handle section 112 as in conventional USB devices, the overall length L of PCB handle section 112 can be shortened, thereby facilitating the production of shorter USB devices that require less material and, hence, are less expensive to manufacture.

As set forth in the previous paragraphs, reduced-length, low-profile USB device 100A is made thinner (low profile) by mounting controller IC and auxiliary IC(s) 135 on lower surface 118 of PCB 111, and is made shorter (reduced length) by moving controller IC 130 forward (i.e., onto plug section 114 and/or below metal contacts 120). Accordingly, the present invention provides USB devices having minimal size and manufacturing costs by combining these features.

Referring again to FIGS. 3(A) and 3(B), in accordance with another aspect of the present invention, PCBA 110 is fabricated using lead-free soldering materials and processes. Lead (Pb) is recognized as a hazardous material, and may at some future point in time be banned from use. Conventional USB structures that utilize standard USB plug connectors typically require lead-based soldering methods to attach the standard plug structure to a plastic substrate. Lead-free soldering requires higher peak temperatures (about 240° C.) that can shrink or warp such plastic substrates, thereby making such conventional USB plug connector structures unsuitable for lead-free fabrication processes. In contrast, because metal contacts 120 are formed directly on PCB 111, which is formed, for example, using FR4. In addition, ICs 130 and 135 are provided as surface mount components that don't contain lead in their pins/balls, thereby further enabling lead-free fabrication. After the lead-free PCBA fabrication process is completed, plastic housing 150 is formed and/or assembled onto PCBA 110 according to the various specific embodiments described below to complete the manufacture of low-profile USB device 100A.

Figure 4A:
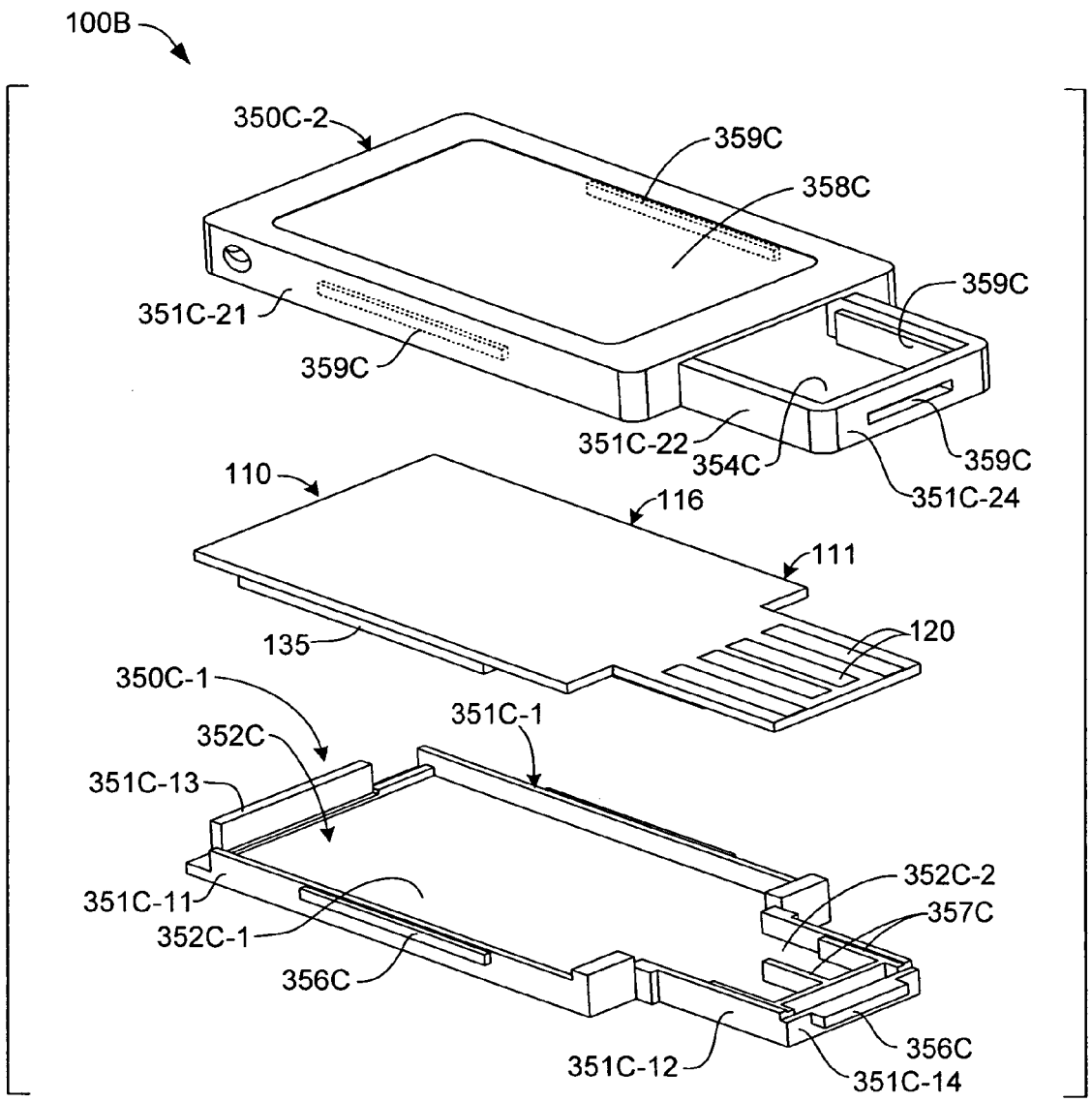
FIGS. 4(A) and 4(B) are exploded perspective and assembled perspective views showing an USB device according to another embodiment of the present invention.
Figure 4B:
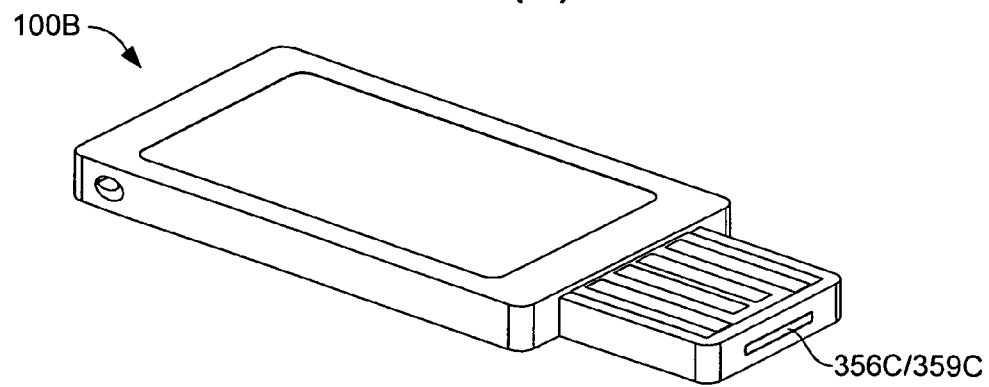

FIGS. 4(A) and 4(B) are exploded and assembled perspective views showing an USB device 100B according to another specific embodiment of the present invention. USB device 100B generally includes a lower (first) housing portion 350C-1, and upper (second) housing portion 350C-2, and PCBA 110.

Lower housing portion 350C-1 generally includes a lower (first) cover plate 352C (including a handle cover section 352C-1 and a plug cover section 352C-2) and an inner peripheral wall 351C-1 (including a handle wall section 351C-11, a plug wall section 351C-12, a rear wall section 351C-13, and a front wall section 351C-14) extending upward from (perpendicular to) opposing edges of cover plate 352C. Several support ribs 357C extend upward from plug cover section 352B-2 that, when assembled, contact and help support plug section 114 of PCB 111.

Upper housing portion 350C-2 generally includes an outer peripheral wall 351C-2 (including a handle wall section 351C-21 and a plug wall section 351C-22) that are sized to fit over inner peripheral wall 351C-1 in the manner described below, and a thin plastic top plate 358C that is integrally formed on upper edges of handle wall section 351C-21. Note that plug wall section 351C-22 defines an opening 354C.

In accordance with an aspect of the present embodiment invention, lower housing portion 350C-1 and upper housing portion 350C-2 are fabricated such that the housing portions can be snap-coupled over PCBA 110 during the housing assembly process. In particular, the respective peripheral walls of housing portions 350C-1 and 350C-2 are constructed such that inner peripheral wall 351C-1 can be inserted inside peripheral wall 351C-2, whereby the outside surfaces of peripheral wall 351C-1 abut the inside surfaces of peripheral wall 351C-2. In addition, either a slot or a tab are provided on the outside surface of inner peripheral walls 351-C1, and a corresponding tab or slot are provided on the inside surfaces of outer peripheral wall 351C-2, wherein each tab is snap-coupled into a corresponding slot when upper housing portion 350C-1 is mounted onto the lower housing portion 350C-2. In the present embodiment, the outside surfaces of side peripheral walls 351C-11 and front wall 351C-14 of lower housing portion 350C-1 include respective tabs 356C, and the inside surfaces of side peripheral walls 351C-21 and front wall 351C-24 of upper housing portion 350C-2 defines corresponding slots 359C such that each tab 356C is snap-coupled into a corresponding slot 359C when upper housing portion 350C-2 is mounted onto lower housing portion 350C-1 (e.g., as shown in FIG. 4(B)). Note that the number of slots/tabs provided on each peripheral wall may be substantially arbitrarily selected, as well as the peripheral wall (inner or outer) on which the tabs/slots are provided.

Figure 5:
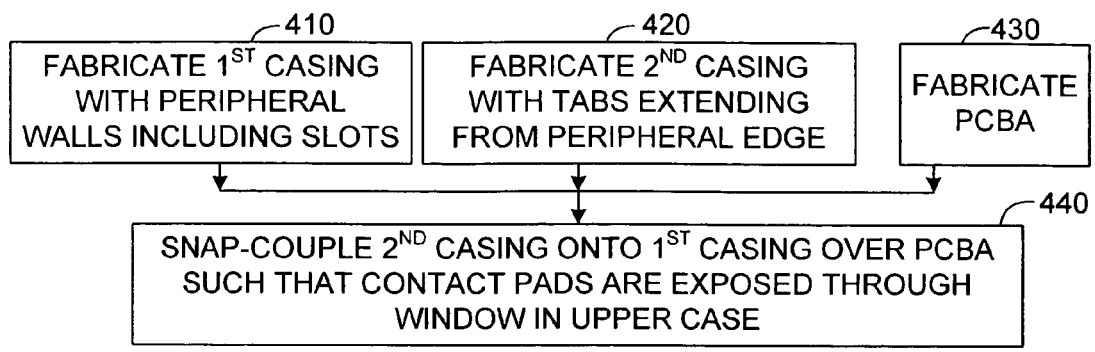
FIG. 5 is a flow diagram showing a method for assembling the USB device of FIG. 4(B) according to another embodiment of the present invention.

FIG. 5 is a flow diagram depicting a method for manufacturing USB devices according to another embodiment of the present invention. The method begins by forming (e.g., by plastic injection molding) a first housing portion (block 410), a second housing portion (block 420), and a PCBA (block 430). First housing portion (e.g., lower housing portion 350C-1) and second housing portion (e.g., upper housing portion 350C-2) may be formed, for example, using known plastic injection molding techniques, to include corresponding tabs and slots in the respective peripheral walls in order to facilitate the snap-coupling process described herein. Note that PCBA may be formed at a significantly different time frame from the housing portions, thereby facilitating the sale of the housing portions in an assembly kit. Then, the housing portions are mounted over the PCBA and snap-coupled together such that the contact pads 120 formed on PCB plug section 114 are exposed through window 354C formed in upper housing portion 350C-2 (block 440).

Figure 6A:
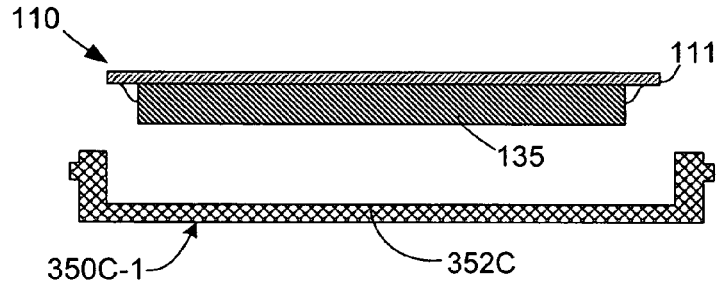
FIGS. 6(A), 6(B) and 6(C) are cross-sectional end views depicting the USB device of FIG. 4(B) during successive assembly stages.
Figure 6B:
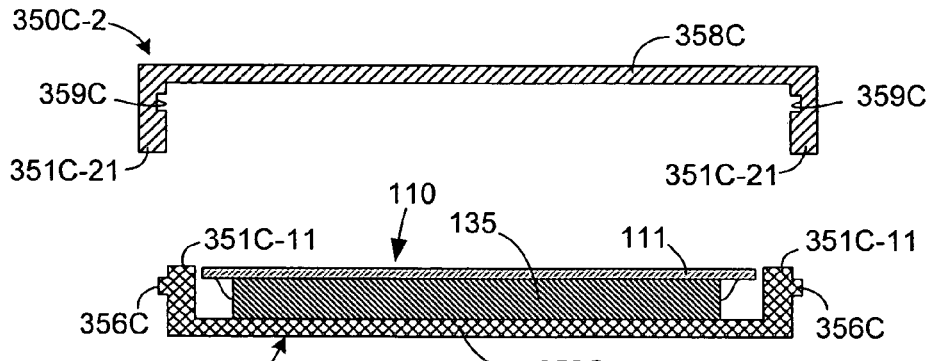
Figure 6C:
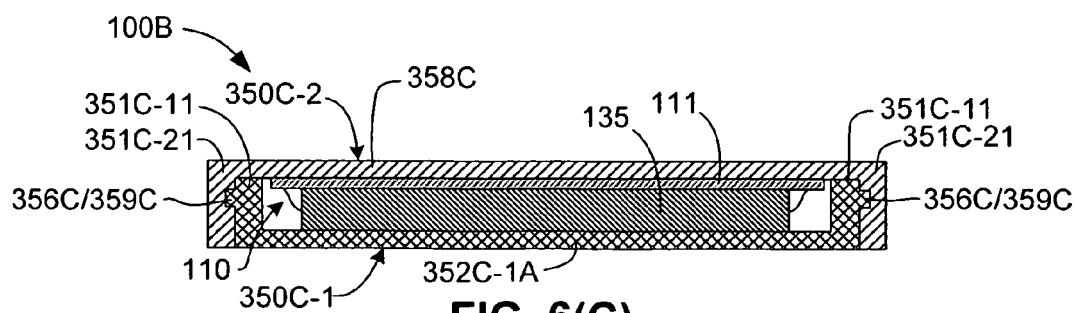

FIGS. 6(A) to 6(C) are cross-sectional end views depicting the snap coupling process associated with the assembly methods of FIG. 5. Referring to FIG. 6(A), PCBA 110 is positioned over lower housing portion 350C-1 with IC 135 facing downward. FIG. 6(B) depicts a sub-assembly formed by PCBA 110 and lower housing portion 350C-1, and also depicts upper housing portion 350C-2 positioned over the sub-assembly prior to snap coupling. In particular, side walls 351C-21 and 351C-24 of upper housing portion 350C-2 are positioned over side walls 351C-11 and 351C-14 of lower housing portion 350C-1, and then moved downward until tabs 356C engage slots 359C. FIG. 6(C) shows completed USB device 100B, with upper housing portion 350C-2 mounted onto lower housing portion 350C-1 such that tabs 356C are snap coupled into slots 359C, and top plate 358C is pressed against PCB 111.

FIGS. 7 and 9 are an exploded perspective and assembled perspective view showing an assembly 400 including a reduced-length, low-profile USB device 100 and an associated card-like carrier 500 for housing USB device 100 according to another embodiment of the present invention. USB device 100 represents either of the specific embodiments described above, or "slim" USB devices that include one or more of the features described above. Due to its emphasis on reduced size, USB device 100 may be somewhat more fragile than conventional USB devices, and thus more prone to damage when not in use (e.g., when being transported in a user's pocket). In addition, due to the "slim" plug arrangement (i.e., omitting the plug shell utilized in conventional USB devices), metal contacts 120 of USB device 100 are exposed and therefore subject to contamination or damage from other mechanisms when USB device 100 is not in use. Carrier 500 is provided with the object of providing a convenient structure that both reinforces and protects USB device 100 when USB device 100 is not in use.

Referring to the left side of FIG. 7, carrier 500 generally includes a frame-like base portion 510 that includes support structures 520 and locking structures 530, and an end portion 540 that is attached to one end of base portion 510. Carrier 500 is a molded plastic structure formed according to known techniques, but may also be formed using aluminum.

Base portion 510 includes peripheral walls 512 that surround a relatively wide main chamber 515. Peripheral walls 512 include opposing first side wall 512-1 and second side wall 512-2 that extend from end portion 540, and a rear wall 512-3 that extends between first and second side walls 512-1 and 512-2. Inside edges of first and second side walls 512-1 and 512-2 are spaced such that main chamber 515 has a relatively wide width W3 that is slightly larger than a width of handle structure 102 of USB device 100.

In accordance with an aspect of the present invention, carrier 500 includes support structures 520 that are disposed on lower edges 512L of at least some of peripheral walls 512, and extend inward from peripheral walls 512 (i.e., into the main chamber 515). In one embodiment, as indicated in FIGS. 7 and 8(A), a rail-like first support structure 520 extending along lower edge 512L of first side wall 512-1. Similar support structures are provided on at least one of second side wall 512-2 and rear wall 512-3. As discussed below, support structures 520 are utilized to support USB device 100 when USB device 100 is mounted inside main chamber 515.

In accordance with an aspect of the present invention, carrier 500 includes one or more locking structures 530 disposed along upper edges 512U of at least one of the peripheral walls 512. In one embodiment, each locking structure 530 comprises a protrusion extending from the upper edge 512U of at least one of first and second side walls 512-1 and 512-2 and rear wall 512-3. As discussed below, locking structures 530 are utilized to snap-couple USB device 100 inside main chamber 515 when USB device 100 is mounted onto carrier 500.

End portion 540 is located at an end of base portion 510 opposite to rear wall 512-3, and includes opposing end walls 542-1 and 542-2 defining a slot 545 that opens into (communicates with) main chamber 515. End walls 542-1 and 542-2 are integrally attached to first and second side walls 512-1 and 512-2, respectively, and have end faces that extend inward from first and second side walls 512-1 and 512-2 such that slot 545 has a relatively narrow width W4 that is narrower than width W3 of base portion 510. In one embodiment, a cover plate 547 extends between first and second end walls 542-1 and 542-2 over slot 545. As discussed below, slot 545 is utilized to protect metal contacts 120 when USB device 100 is mounted onto carrier 500.

FIGS. 8(A) and 8(B) are cross-sectional side views illustrating a process for mounting USB device 100 onto carrier 500 in accordance with an aspect of the present invention. As indicated in FIG. 8(A), USB device 100 is mounted onto carrier 500 by inserting plug structure 105 in the direction indicated by arrow A through main chamber 515 and into slot 545 until a front edge of handle structure 102 abuts end walls 542. At this point, handle structure 102 is rotated downward (as indicated by arrow B) toward main chamber 515. Locking structures 530 abut side edges of handle structure 102, and are constructed using known techniques to facilitate a snap-coupling process as handle structure 102 is pushed from above into main chamber 515 (i.e., one or both of locking structures 530 and side walls 512 resiliently yield to allow passage of handle structure 102 into main chamber 515). As indicated in FIGS. 8(B) and 9, when USB device 100 is fully mounted onto carrier 500, a peripheral edge 107 of handle structure 102 is maintained parallel to peripheral walls 512 of base portion 510. In this mounted position, a lower edge of handle structure 102 is supported by support structures 520, and locking structures 530 resist upward movement of handle structure 102, thereby maintaining USB device 100 inside carrier 500 until sufficient upward force (i.e., opposite to arrow B in FIG. 8(A)) is applied to handle portion 107 to overcome the resistance provided by locking structures 530. In addition, when USB device 100 is in the mounted position, plug structure 105 of USB device 100 is received inside slot 545, and cover wall 547 is positioned over an upper surface of plug structure 105 to protect metal contacts 120 from contamination or damage when not in use.

Figure 10:
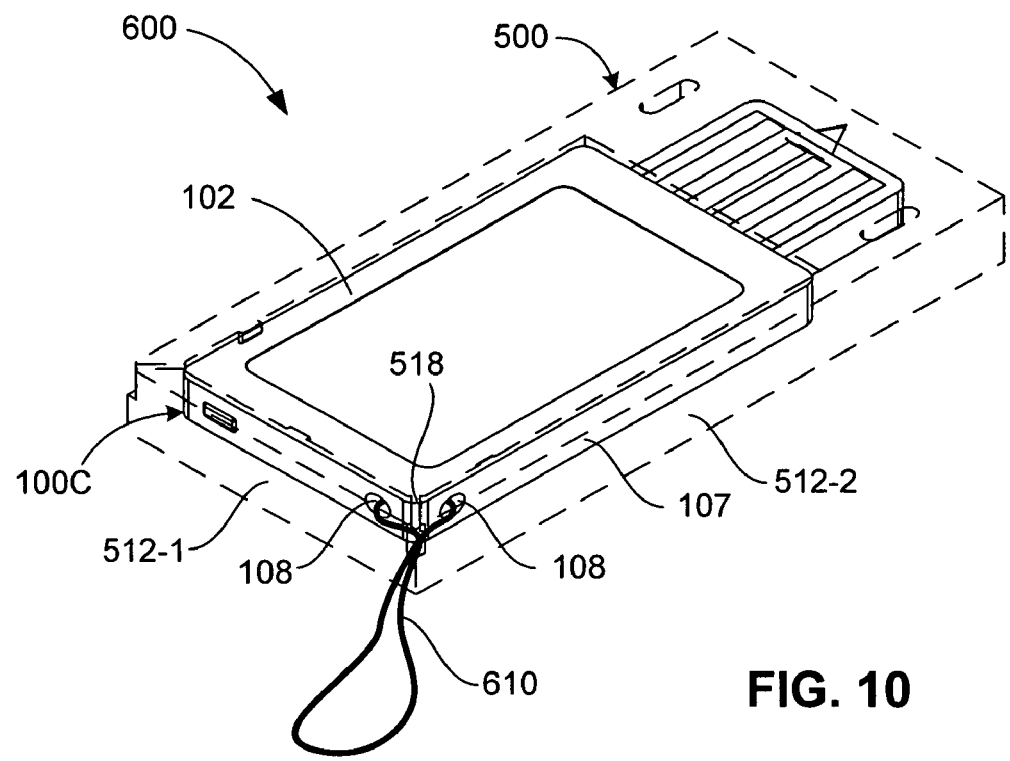
FIG. 10 is a perspective view showing the carrier of FIG. 7 with a USB device that includes a keychain in accordance with another embodiment of the present invention.

The various reduced-length, low-profile USB device structures described herein may be beneficially utilized in conjunction with carrier 500 for various portable applications and modified for various purposes due to their substantially flat design. For example, as indicated in FIG. 10, a key chain-type USB device assembly 600 includes a USB device 100C mounted inside carrier 500 (shown in hidden lines for illustrative purposes), wherein a peripheral wall 107 of handle structure 102 defines holes 108 for receiving a key chain 610 that passes through a groove 518 defined at an intersection of second side wall 512-2 and rear wall 512-3 of carrier 500 (also shown in FIG. 7), thus providing a dual-use structure that can be easily carried in a user's pocket. In addition, the various low-profile USB device structures may be modified to serve as convenient external storage for, for example, MP3 players (i.e., media storage for music), digital cameras, and mobile phones. USB device 100C is otherwise similar to the embodiments described above.

Figure 11:
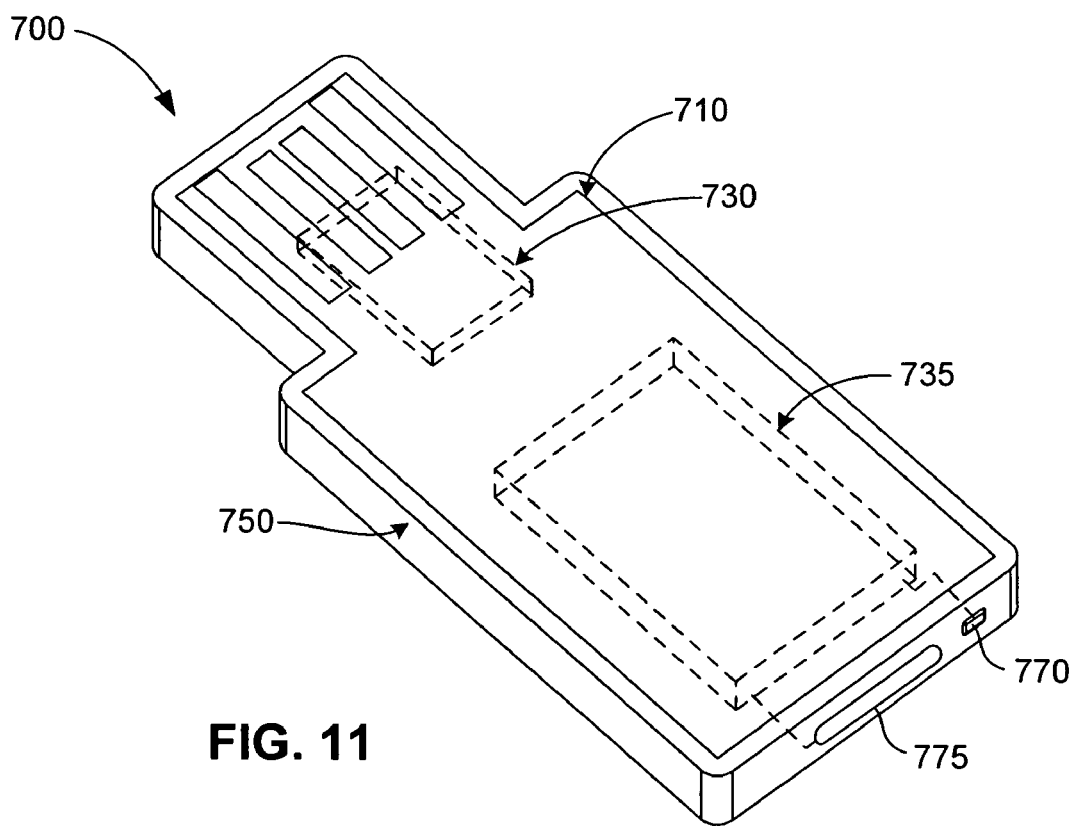
FIG. 11 is a perspective view showing a wireless communication-type USB device produced in accordance with another embodiment of the present invention.
Figure 12A:
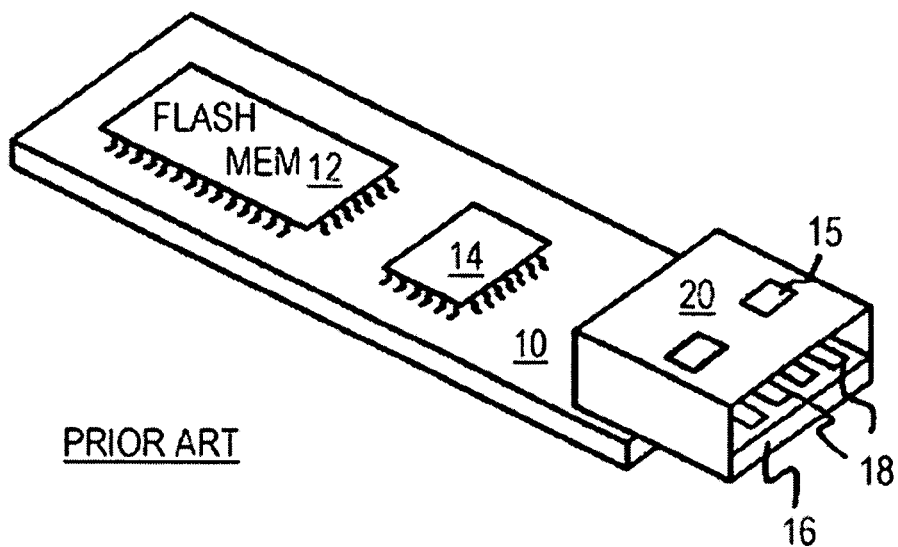
FIG. 12(A) shows a prior-art flash-memory card with a USB connector.
Figure 12B:
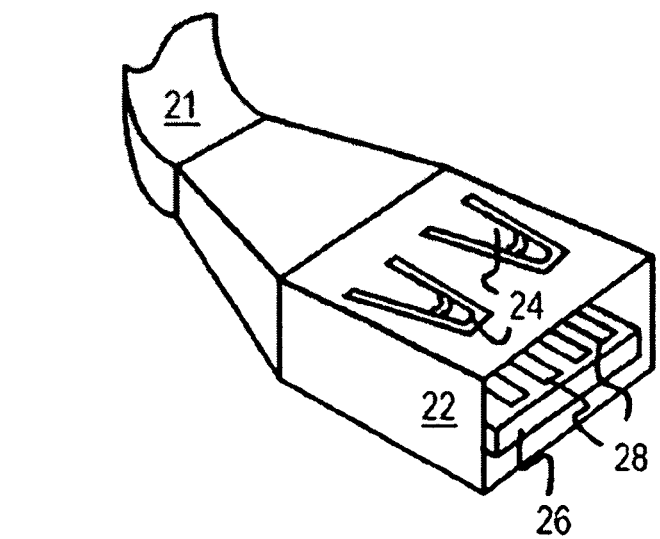
FIG. 12(B) shows a female USB connector.

Another embodiment utilizes the disclosed USB device structures to facilitate wireless communications. In this case, a USB device (e.g., Bluetooth USB adapter 700 shown in FIG. 11) may be plugged into the USB port of a host device, and may include a wireless communication device 735 that generates wireless signals emitted from transceiver antenna 775, which may be provided on a back side of housing 750 to maximize the effect of signal transmission. Wireless communication device 735 communicates with a host (e.g., a computer) via USB control IC 730, and includes a Bluetooth controller, a radio frequency (RF) transceiver, a baseband controller, memory (e.g., EEPROM), a voltage regulator, a crystal, and a control circuit for controlling LED 770. These circuits may be combined together, along with passive circuits (e.g., resistors, capacitors and inductors) in a single chip, as depicted, or formed on one or more separate chips that are mounted on PCB 710 and enclosed by housing 750. Such an arrangement would facilitate communication between the host and a wireless communication device, such as a Bluetooth-enabled device. Bluetooth is a wireless technology that enables any electrical device to wirelessly communicate in the 2.4 GHz frequency band. It allows devices such as mobile phones, headsets, PDA's and computers to communicate and send data to each other without the need for wires or cables to link two devices together. It has been specifically designed as a low cost, low power, radio technology, which is particularly suited to the short range Personal Area Network (PAN) application. By plugging Bluetooth USB adapter 700 into the USB port, the Bluetooth USB adapter enables a non-Bluetooth electrical device (i.e., the host) to communicate with Bluetooth enabled devices. One specific wireless application may be a Bluetooth mouse device, which are used today for cursor pointing. Another application example is allowing computer user doing two-way communication to Bluetooth-wireless equipped mobile phones, PDA, keyboard, printer, digital camera, and MP3 player. Other applications may include wireless headsets. Yet another application may include enabling Bluetooth wireless connections inside an automobile to facilitate "hands free" operation of a mobile phone. Of course, other wireless communication protocols, such as IrDA infrared transmitting devices, may also be utilized in conjunction with USB devices of the present invention.

Although the present invention has been described with respect to certain specific embodiments, it will be clear to those skilled in the art that the inventive features of the present invention are applicable to other embodiments as well, all of which are intended to fall within the scope of the present invention. For example, in addition to protecting the reduced-length, low profile USB devices described herein, the card-like carrier of the present invention may be utilized to support any "slim" USB device that omits the plug cage provided on conventional USB devices.

The invention claimed is:

1. A reduced-length, low-profile Universal-Serial-Bus (USB) device comprising:
   a printed circuit board assembly (PCBA) including:
      a printed circuit board (PCB) including a relatively wide PCB handle section and a relatively narrow PCB plug section, the PCB having opposing first and second surfaces,
      a plurality of metal contacts disposed on the first surface of the PCB plug section,
      first and second integrated circuits (ICs) mounted on the second surface of the PCB, the first IC including means for processing USB signals, and
      a plurality of conductive structures mounted on the PCB for passing signals between the metal contacts and the first IC; and
   a housing attached to the PCBA and including a cover plate extending over both the PCB handle section and the PCB plug section,
   wherein the first IC is at least partially mounted on the PCB plug section of the PCB,
   wherein the cover plate includes a planar surface that is parallel to the PCB, and
   wherein a first thickness measured between the first surface of the PCB and the planar surface adjacent to the metal contacts is substantially equal to a second thickness between the first surface of the PCB and the planar surface adjacent to the IC.

2. The USB device according to claim 1, wherein the first IC comprises a USB controller IC that is at least partially located below the plurality of metal contacts.

3. The low-profile USB device of claim 1, wherein the PCBA comprises a lead-free structure.

4. The low-profile USB device of claim 1, wherein the housing comprises:
- a first housing portion including the cover plate and a first peripheral wall extending perpendicular to the cover plate;
- a plurality of tabs formed on an outside surface of the first peripheral wall;
- a second housing portion including a thin plastic plate and a second peripheral wall extending perpendicular to the thin plastic plate,
- wherein an inside surface of the second peripheral wall defines a plurality of slots arranged such that, when the second housing portion is mounted over the first housing portion, each of the tabs formed on the first peripheral wall is engaged to a corresponding said slot formed on the second peripheral wall.

5. The low-profile USB device of claim 1, wherein the ICs include a wireless communication transmission device.

6. The low-profile USB device of claim 1, wherein the housing defines at least one hole for receiving a key chain therein.

7. The assembly of claim 1, wherein a maximum thickness of the housing is substantially equal to the first thickness.

8. The assembly of claim 1,
- wherein the housing comprises a peripheral wall extending perpendicular to the cover plate, the peripheral wall including a plug wall section surrounding a peripheral edge of the PCB plug section, the plug wall section having a lower end disposed adjacent to the cover plate, and an upper end disposed adjacent to the PCB plug section,
- wherein the peripheral edge of the PCB plug section is covered by the upper end of the plug wall section, and
- wherein an upper edge of plug wall section is coplanar with the first surface of the PCB.

* * * * *